(12) United States Patent
Hsu et al.

(10) Patent No.: US 8,643,069 B2
(45) Date of Patent: Feb. 4, 2014

(54) SEMICONDUCTOR DEVICE HAVING METAL GATE AND MANUFACTURING METHOD THEREOF

(75) Inventors: Chun-Wei Hsu, Taipei (TW); Po-Cheng Huang, Chiayi (TW); Teng-Chun Tsai, Tainan (TW); Chia-Lin Hsu, Tainan (TW); Chih-Hsun Lin, Ping-Tung County (TW); Yen-Ming Chen, New Taipei (TW); Chia-Hsi Chen, Kao-Hsiung (TW); Chang-Hung Kung, Kaohsiung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 173 days.

(21) Appl. No.: 13/180,556

(22) Filed: Jul. 12, 2011

(65) Prior Publication Data

US 2013/0015524 A1  Jan. 17, 2013

(51) Int. Cl.
*H01L 29/76* (2006.01)
*H01L 21/02* (2006.01)

(52) U.S. Cl.
USPC .......................................... 257/288; 257/344

(58) Field of Classification Search
USPC .......... 257/288, 305, 320, 335, 369, 371, 344
See application file for complete search history.

(56) References Cited

U.S. PATENT DOCUMENTS

| | | | |
|---|---|---|---|
| 5,563,096 A | 10/1996 | Nasr | |
| 5,847,421 A | 12/1998 | Yamaguchi | |
| 5,950,090 A | 9/1999 | Chen | |
| 6,171,436 B1 | 1/2001 | Huynh et al. | |
| 6,372,605 B1 | 4/2002 | Kuehne et al. | |
| 6,664,190 B2 | 12/2003 | Chen et al. | |
| 7,166,506 B2 | 1/2007 | Prince et al. | |
| 7,195,535 B1 | 3/2007 | Swedek et al. | |
| 7,196,010 B2 | 3/2007 | Park et al. | |
| 7,399,437 B2 | 7/2008 | James et al. | |
| 7,687,393 B2 | 3/2010 | Iwasa | |
| 2003/0166338 A1 | 9/2003 | Ahn et al. | |
| 2005/0001267 A1* | 1/2005 | Miyagawa et al. | 257/332 |
| 2007/0063223 A1* | 3/2007 | Choi | 257/202 |
| 2008/0070371 A1* | 3/2008 | Wang | 438/301 |
| 2011/0014773 A1 | 1/2011 | Lin et al. | |
| 2011/0086502 A1* | 4/2011 | Yeh et al. | 438/585 |

* cited by examiner

*Primary Examiner* — Walter H Swanson
*Assistant Examiner* — Wilner Jean Baptiste
(74) *Attorney, Agent, or Firm* — Winston Hsu; Scott Margo (57) ABSTRACT

A semiconductor device having a metal gate includes a substrate having a plurality of shallow trench isolations (STIs) formed therein, at least a metal gate positioned on the substrate, and at least a pair of auxiliary dummy structures respectively positioned at two sides of the metal gate and on the substrate.

9 Claims, 7 Drawing Sheets

SEMICONDUCTOR DEVICE HAVING METAL GATE AND MANUFACTURING METHOD THEREOF

BACKGROUND OF THE INVENTION

1. Field of the Invention

The invention relates to a semiconductor device having metal gate and manufacturing method thereof, and more particularly, to a semiconductor device having metal gate and manufacturing method thereof integrated with the gate last process.

2. Description of the Prior Art

Polysilicon is conventionally used as the gate electrode in a semiconductor device, such as the metal-oxide-semiconductor (MOS) transistor. However, with a trend toward scaling down the size of the semiconductor device, the conventional polysilicon gate has faced problems such as inferior performance due to boron penetration and unavoidable depletion effect which increases equivalent thickness of the gate dielectric layer, reduces gate capacitance, and worsens a driving force of the devices. Therefore, work function metals are used to replace the conventional polysilicon gate to be the control electrode that competent to the high dielectric constant (high-K) gate dielectric layer.

The conventional dual metal gate methods are categorized into the gate first process and the gate last process. In a conventional dual metal gate method applied with the gate first process, the anneal process for forming the source/drain ultra-shallow junction, and the silicide process are performed after forming the metal gate. The thermal budgets always make the gate first process face challenges for material choices. Consequently, the gate last process is developed to provide more material choices for the high-K gate dielectric layer and the metal gate, and thus replaces the gate first process.

Though the gate last process is able to avoid processes of high thermal budget and to provide more material choices for the high-K gate dielectric layer and the metal gate, the gate last process still faces integration requirements, such as to ensure the metal gate obtains the expected height, for the complicated processes.

SUMMARY OF THE INVENTION

According to an aspect of the present invention, a manufacturing method for a semiconductor device having metal gate is provided. The manufacturing method includes providing a substrate having a plurality of shallow trench isolations (hereinafter abbreviated as STIs) formed therein and a polysilicon layer formed thereon; patterning the polysilicon layer to form at least a dummy gate and at least a pair of auxiliary dummy structures, the auxiliary dummy structures being positioned on the STI respectively at two sides of the dummy gate; forming at least a semiconductor device having the dummy gate on the substrate; forming a dielectric structure on the substrate; and removing a portion of the dielectric structure to expose the dummy gate of the semiconductor device and the auxiliary dummy structures.

According to another aspect of the present invention, a semiconductor device having metal gate is provided. The semiconductor device includes a substrate having a plurality of STIs formed therein, at least a metal gate positioned on the substrate, and at least a pair of auxiliary dummy structures respectively positioned at two sides of the metal gate and on the STIs.

According to the manufacturing method for a semiconductor device having metal gate provided by the present invention, a pair of auxiliary dummy structures is formed respectively at the two sides of the dummy gate simultaneously with forming the dummy gate. Because of the auxiliary dummy structures, the consumption to edges of the dummy gate, particularly at where the dummy gate adjoining the dielectric structure, is transferred to the edges of the auxiliary dummy structures, particularly at where the auxiliary dummy structures adjoining the dielectric structure. Consequently, no consumption is occurred to the polysilicon layer, and thus no height loss is resulted in the dummy gate after the dummy gate is exposed. More important, a metal gate subsequently formed obtains a height equal to the original height of the dummy gate. In other words, the metal gate is ensured to have a height the same with original height of dummy gate without any loss. Accordingly, the present invention provides a semiconductor device having metal gate and a manufacturing method thereof that ensures the electrical performance and reliability of the metal gate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3-9 are schematic drawings illustrating a manufacturing method for a semiconductor device having metal gate provided by a first preferred embodiment of the present invention, wherein

DETAILED DESCRIPTION

Figure 1:
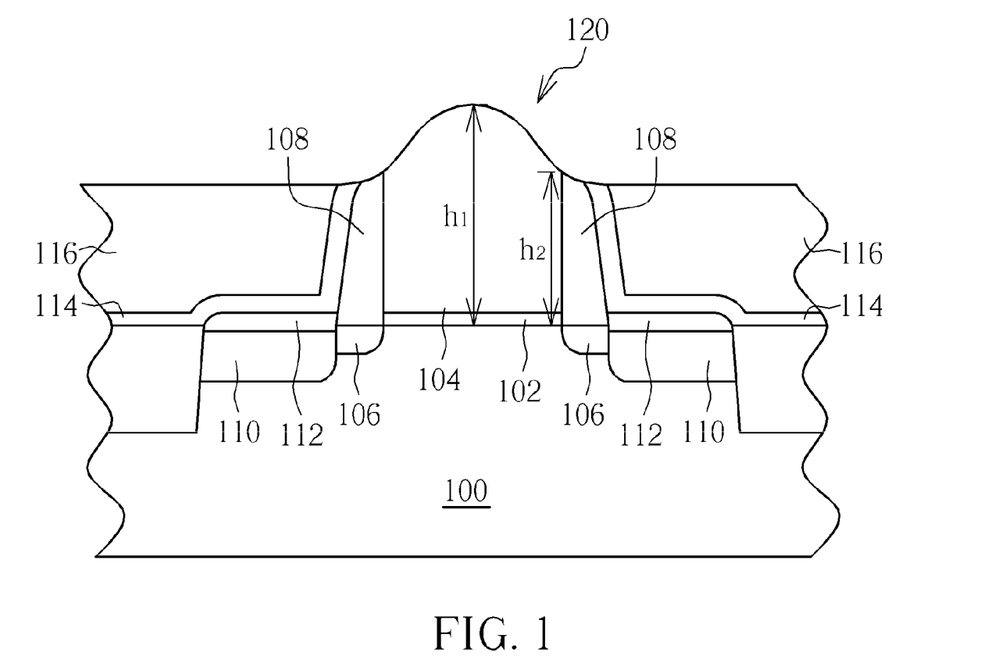
FIGS. 1-2 are schematic drawings illustrating a manufacturing method for a semiconductor device having metal gate.
Figure 2:
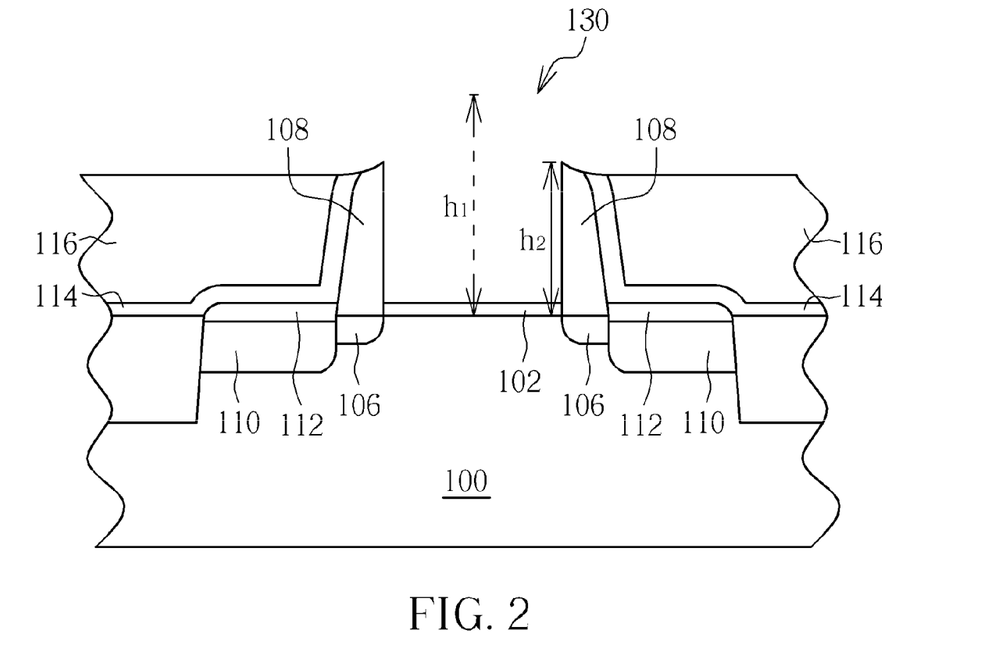

Please refer to FIGS. 1-2, which are schematic drawings illustrating a manufacturing method for a semiconductor device having metal gate. As shown in FIG. 1, a substrate 100 is first provided with a dummy gate or a replacement gate 120 formed thereon. The dummy gate 120 includes a high-k gate dielectric layer 102, a titanium nitride (TiN) layer (not shown) serving as a bottom barrier layer, and a polysilicon layer 104 defined by a patterned hard mask (not shown). The dummy gate 120 has a height $h_1$ that is almost equal to a thickness of the polysilicon layer 104. More important, the height $h_1$ of the dummy gate 120 is to be a height of a following formed metal gate. After forming elements for the n-type transistor or p-type transistor such as lightly-doped drains (LDDs) 106, a spacer 108, and a source/drain 110, and other elements such as silicides 112, a contact etch stop layer (CESL) 114, and an inter-layer dielectric (ILD) layer 116, the gate last process is to remove the polysilicon layer 104 of the dummy gate 120.

Please still refer to FIG. 1. During removing the polysilicon layer 104, a planarization process, such as a chemical mechanical polishing (CMP) process is performed to remove a portion of the ILD layer 116 and the CESL 114, thus the patterned hard mask is exposed. Then, another CMP process is performed to remove a portion of the ILD layer 116, a portion of the CESL 114, and the patterned hard mask to expose the polysilicon layer 104. Because an etching rate of the polysilicon layer 104 is significantly different from etching rates of the ILD layer 116, the CESL 114 and the patterned hard mask that all include insulating material, the CMP process is supposed to stop at the polysilicon layer 104 and thus exposes the polysilicon layer 104. However, it is found that the CMP process always consumes the polysilicon layer 104 at edges of the polysilicon layer 104, particularly at where the polysilicon layer 104 adjoining the patterned hard mask, even at wherein the polysilicon layer 104 adjoining the spacer 108. Consequently, the edges of the polysilicon layer 104, even the spacer 108, is consumed and removed by the CMP process and thus a height deviation is resulted between the center of the polysilicon layer 104 and the edges of the polysilicon layer 104. As shown in FIG. 1, the center of the dummy gate 120 has the original height $h_1$ while edges of the dummy gate 120 have a reduced height $h_2$ due to the CMP consumption. More important, the original height $h_1$ is larger than the reduced height $h_2$.

Please refer to FIG. 2. Next, the polysilicon layer 104 of the dummy gate 120 is removed to form a gate trench 130. It is noteworthy that the original height $h_1$ of the removed dummy gate 120 is depicted by the dashed line in FIG. 2 for emphasizing the height deviation. As shown in FIG. 2, a depth of the gate trench 130 is equal to the reduced height $h_2$ instead of the expected original height $h_1$. A metal gate (not shown) is subsequently formed in the gate trench 130, and the metal gate inherently obtains the reduced height $h_2$. Accordingly, the reduced height $h_2$ of the metal gate formed by filling the gate trench 130 with work function metal material and filling metal material is not the same with the original and expected height $h_1$ of the dummy gate 120, which means the metal gate unavoidably and undesirably suffers height loss. In other word, the reduced height $h_2$ of the metal gate is significantly lower than an expected value, and thus the reliability and the electrical performance of the metal gate are adversely impacted. In addition, it is found that the height loss is more serious when the density of the dummy gate 120 is increased. For example, it is found the height deviation between the reduced height $h_2$ and the original height $h_1$ reaches 400 angstroms (Å) and the serious height deviation terribly induces adverse impact to the reliability and performance of the metal gate.

Figure 3:
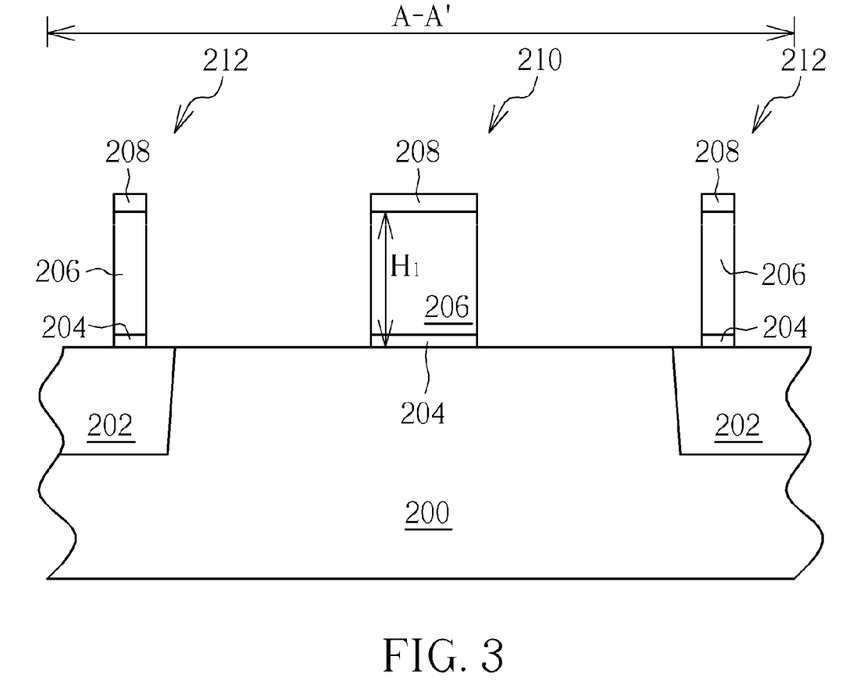
FIG. 3 is a cross-sectional view taken along line A-A' of FIG. 9.
Figure 7:
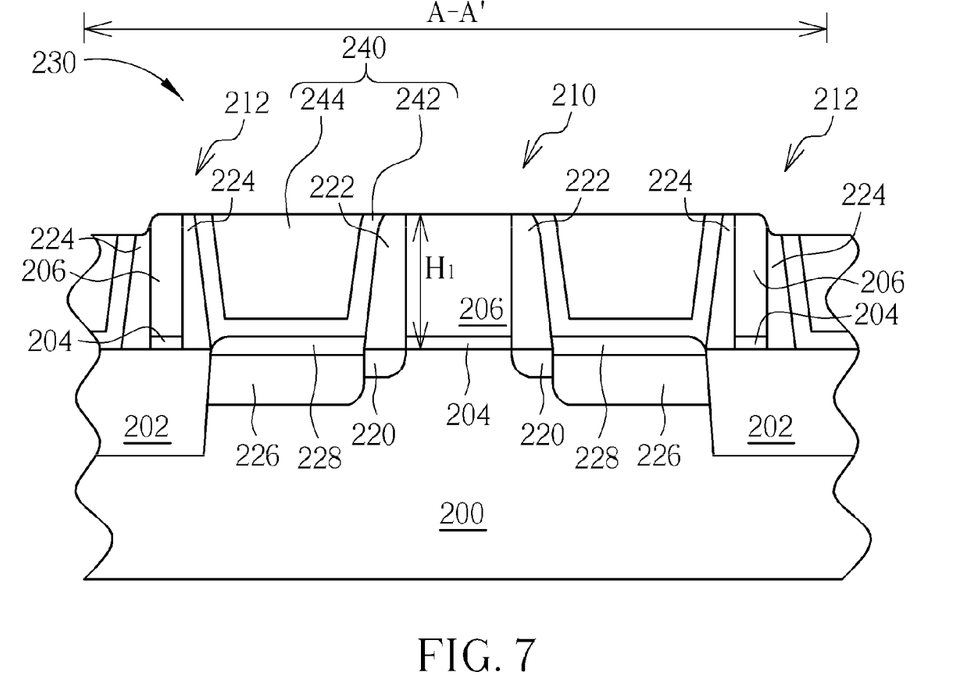
FIG. 7 is a cross-sectional view in a step subsequent to FIG. 6.
Figure 8:
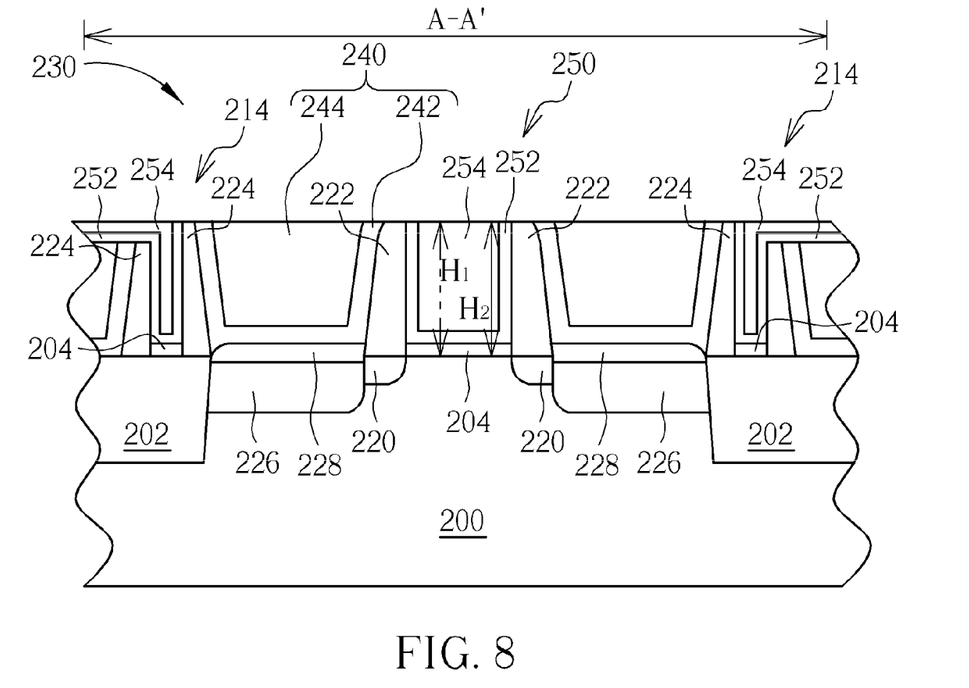
FIG. 8 is a cross-sectional view in a step subsequent to FIG. 7.
Figure 9:
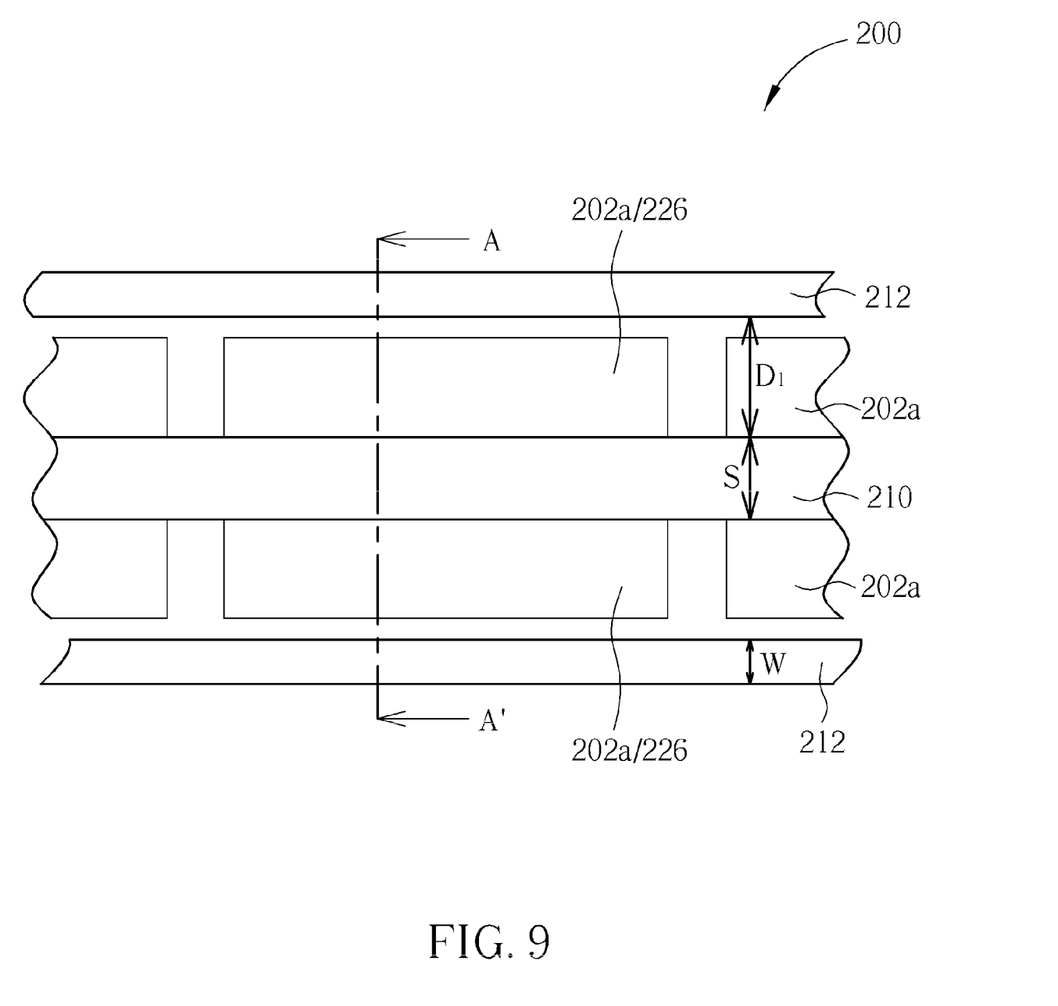
FIG. 9 is a top view illustrating the preferred embodiment of the present invention.

Please refer to FIGS. 3-9, which are schematic drawings illustrating a manufacturing method for a semiconductor device having metal gate provided by a first preferred embodiment of the present invention, wherein FIG. 9 is a top view illustrating the preferred embodiment of the present invention and FIGS. 3-8 are cross-sectional view taken along line A-A' in FIG. 9. As shown in FIG. 3, the preferred embodiment first provides a substrate 200 such as a silicon substrate, a silicon-containing substrate, or a silicon-on-insulator (SOI) substrate. The substrate 200 includes a plurality of STIs 202 formed therein. The STIs provide electrical isolation between devices and define a plurality of active regions 202*a* (show in FIG. 9). And a gate dielectric layer 204 and a polysilicon layer 206 are sequentially formed on the substrate 200. It is noteworthy that the preferred embodiment can be integrated with the high-k first process or the high-k last process. When the preferred embodiment is integrated with the high-k first process, the dielectric layer 204 serves as the gate dielectric layer and includes high dielectric constant (hereinafter abbreviated as high-k) material such as metal oxide, particularly the rare earth metal oxide. For instance, the high-k gate dielectric layer 204 can include material selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), and barium strontium titanate ($Ba_xSr_{1-x}TiO_3$, BST). In addition, an interfacial layer (not shown) is preferably formed between the high-k gate dielectric layer 204 and the substrate 200 and a bottom barrier layer (not shown) is preferably formed between the high-k gate dielectric layer 204 and the polysilicon layer 206. The bottom barrier layer can include titanium nitride (TiN), but not limited to this. In addition, when the preferred embodiment is integrated with the high-k last process, the gate dielectric layer 204 can include a conventional silicon oxide layer.

Please refer to FIG. 3 and FIG. 9. Next, an etching process is performed with a patterned hard mask 208 serving as an etching mask. Accordingly, the polysilicon layer 206 and the gate dielectric layer 204 are etched and thus at least a dummy gate 210 crossing the plurality of active regions 202*a* is formed on the substrate 200. The dummy gate 210 includes a first height $H_1$. As shown in FIG. 3, the dummy gate 210 upwardly includes the gate dielectric layer 204 and the polysilicon layer 206. It is noteworthy that at least a pair of auxiliary dummy structures 212 is formed simultaneously with forming the dummy gate 210. According to the preferred embodiment, the auxiliary dummy structures 212 are parallel with the dummy gate 210, and more important, are respectively formed at two sides of the dummy gate 210 as shown in FIG. 3. The auxiliary dummy structures 212 are formed on the substrate 200 and particularly on the STI 202 at the two sides of the dummy gate 210. As shown in FIG. 9, the auxiliary dummy structures 212 are formed within the STIs 202, thus the auxiliary dummy structures 212 never contact the active regions 202*a*. The auxiliary dummy structure 212 includes a width W (shown in FIG. 9), and the width is between about 0.03 micrometer (hereinafter abbreviated as μm) and about 0.1 μm. The dummy gate 210 and the auxiliary dummy structure 212 include a first spacing width $D_1$ defined therebetween, and the first spacing width $D_1$ is between about 0.1 μm and about 0.18 μm. It is noteworthy that the first spacing width $D_1$ corresponds to a line width S of the dummy gate 210. For example, the first spacing width $D_1$ (between about 0.1 μm and about 0.18 μm in the preferred embodiment) is provided for the dummy gate 210 having the line width S of about larger than 1 micrometer (μm). However, the first spacing width $D_1$ can be reduced correspondingly when the line width S of the dummy gate is reduced. Thus the auxiliary dummy structures 212 always provide sufficient assistance which is described in the following description. It is noteworthy that the preferred embodiment always forms the auxiliary dummy structures 212 when the dummy gate 210 has the line width S larger than 1 μm. Additionally, the auxiliary dummy structure 212 includes a single bar-like structure in the preferred embodiment.

Figure 4:
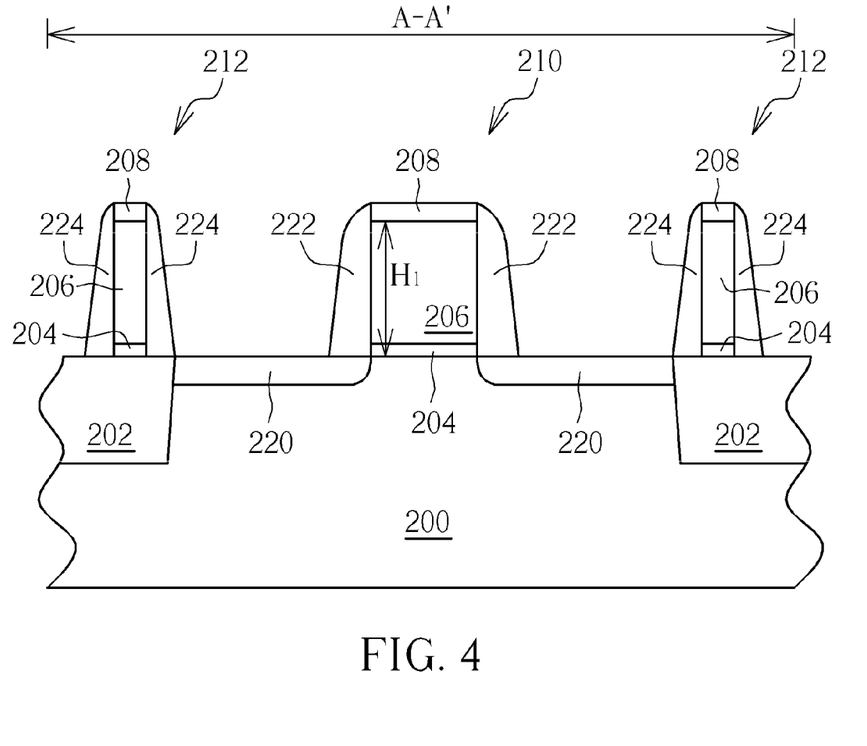
FIG. 4 is a cross-sectional view in a step subsequent to FIG. 3.

Please refer to FIG. 4. After forming the dummy gate 210 and the auxiliary dummy structures 212, steps for forming elements of a semiconductor device such as a metal oxide semiconductor (MOS) device are sequentially performed: For example, an ion implantation is first performed to form lightly-doped drains (LDDs) 220 in the substrate 200 respectively at two sides of the dummy gate 210. Additionally, an offset spacer (not shown) can be formed on sidewalls of the dummy gate 210 before forming the LDDs 220. Then, an insulating layer or a multiple insulating layer (not shown) is formed on the substrate 200 and followed by performing an etching back process. Consequently a first spacer 222 is formed on sidewalls of the dummy gate 210. It is noteworthy that during performing the etching back process, a second spacer 224 having layer(s) the same with the first spacer 222 is formed on sidewalls of the auxiliary dummy structures 212 according to the preferred embodiment.

Figure 5:
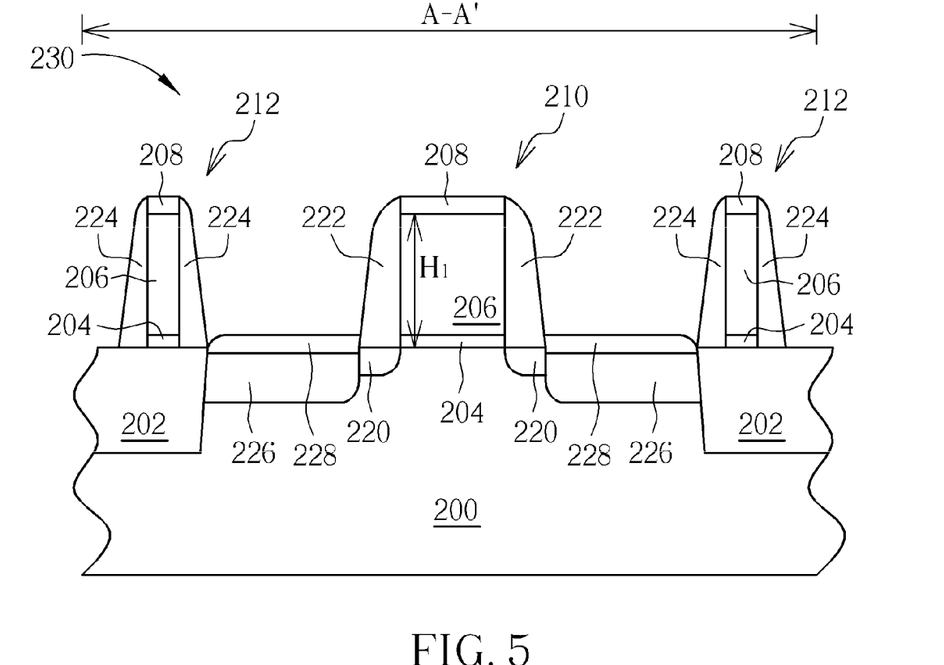
FIG. 5 is a cross-sectional view in a step subsequent to FIG. 4.

Please refer to FIG. 5 and FIG. 9. After forming the first spacer 222 and the second spacer 224, another ion implantation is performed to form a source/drain 226 in the substrate 200 at two sides of dummy gate 210, particularly at two sides of the first spacer 222. Furthermore, silicides 228 are formed on the surface of the source/drain 226. Additionally, selective strain scheme (SSS) can be used in the preferred embodiment. For example, a selective epitaxial growth (SEG) method can be used to form the source/drain 226: after forming a trench (not shown) and performing a trench cleaning process, the SEG method is used to form epitaxial silicon layers with silicon germanium (SiGe) for p-type source/drain 226 or to form epitaxial silicon layers with silicon carbide (SiC) for n-type source/drain 226. Accordingly, a semiconductor device 230 having the dummy gate 210 as shown in FIG. 5 is obtained. Since the steps and materials for the abovementioned elements are well-known to those skilled in the art, the details are omitted herein in the interest of brevity. Furthermore, for clarifying and emphasizing the spatial relationship between the auxiliary dummy structures 212 and the dummy gate 210, the LDDs 220, the first spacer 222, the second spacer 224, and the silicides 228 are omitted from FIG. 9. However those skilled in the art would easily realize that those elements should not be ignored. Furthermore, as shown in FIG. 9, the semiconductor devices 230 share the same the dummy gate 210 are electrically connected in series by the dummy gate 210 and the metal gate which is formed afterwards, and the dummy gates 210 of each semiconductor device 230 are electrically isolated from the auxiliary dummy structures 212. In other words, the auxiliary dummy structures 212 are electrically isolated from any dummy gate 210, metal gate, and the active regions 202a.

Figure 6:
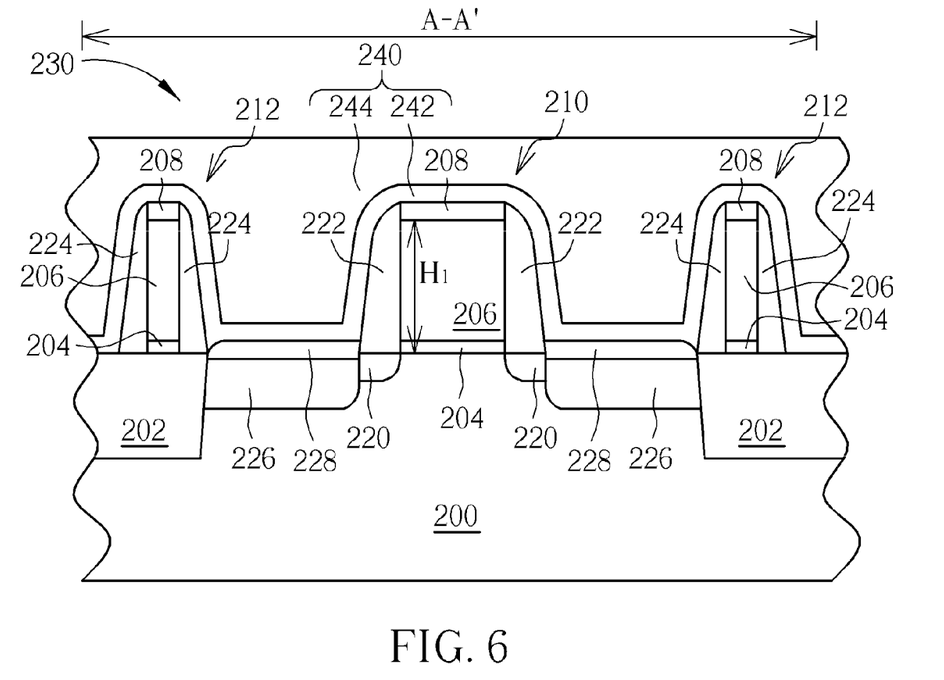
FIG. 6 is a cross-sectional view in a step subsequent to FIG. 5.

Please refer to FIG. 6. After forming the semiconductor device 230, a multilayered dielectric structure 240 including at least a contact etch stop layer (CESL) 242 and an interlayer dielectric (ILD) layer 244 is formed on the substrate 200. As shown in FIG. 6, the multilayered dielectric structure 240 covers the semiconductor device 230, the auxiliary dummy structures 212, and vacancy between the semiconductor device 230 and the auxiliary dummy structure 212.

Please refer to FIG. 7. Next, two planarization processes such as two chemical mechanical polishing (CMP) processes are sequentially performed: a first CMP process is performed to remove a portion of the dielectric structure 240. The first CMP process stops at the patterned hard mask 208. Then, a second CMP process is performed to remove a portion of the dielectric structure 240 and the patterned hard mask 208 to expose the dummy gate 210 (that is the polysilicon layer 206) of the semiconductor device 230. It is noteworthy that because of the auxiliary dummy structures 212, the CMP consumption to edges of the dummy gate 210, particularly at where the dummy gate 210 adjoining the dielectric structure 240 or the first spacer 222, is transferred to edges of the auxiliary dummy structures 212, particularly at where the auxiliary dummy structure 212 adjoining the dielectric structure 240 or the second spacer 224. Therefore, the semiconductor device 230, the dummy gate 210 of the semiconductor device 230, and the dielectric structure 240 between the dummy gate 210 and the auxiliary dummy structures 212 are coplanar after the two CMP processes. On the other hands, the first height $H_1$ of the dummy gate 210 is impervious to the CMP process. Moreover, because the CMP consumption is transferred to the auxiliary dummy structure 212 and the second spacer 224, particularly on the side that is opposite to the dummy gate 210, a portion of the auxiliary dummy structure 212 and the second spacer 224 are consumed during the CMP processes. Therefore, surfaces of a portion of the auxiliary dummy structures 212 and the second spacer 224 are lower than the semiconductor device 230, the dummy gate 210 of the semiconductor device 230, and the dielectric structure 240 between the dummy gate 210 and the auxiliary dummy structures 212.

It should be noted that since the first spacing width $D_1$ between the auxiliary dummy structure 212 and the dummy gate 210 is between 0.1 μm and 0.18 μm, the auxiliary dummy structure 212 serves a sufficient buffer structure and thus CMP consumption is transferred to the auxiliary dummy structures 212. Accordingly, the first height $H_1$ of the dummy gate 210 is protected from the CMP consumption. In addition, it is well-known that the prior art used to position different dummies (not shown) for improving uniformity of the CMP process. However, it should be noted that when the spacing width between the conventional dummy and the dummy gate 210 is larger than 0.18 μm, the CMP consumption cannot be transferred to those dummies and thus the conventional dummies cannot serve as the buffer structure. Briefly speaking, the conventionally dummies cannot protect the first height $H_1$ of the dummy gate 210 from the CMP consumption as the auxiliary dummy structures 212 provided by the preferred embodiment.

Figure 11:
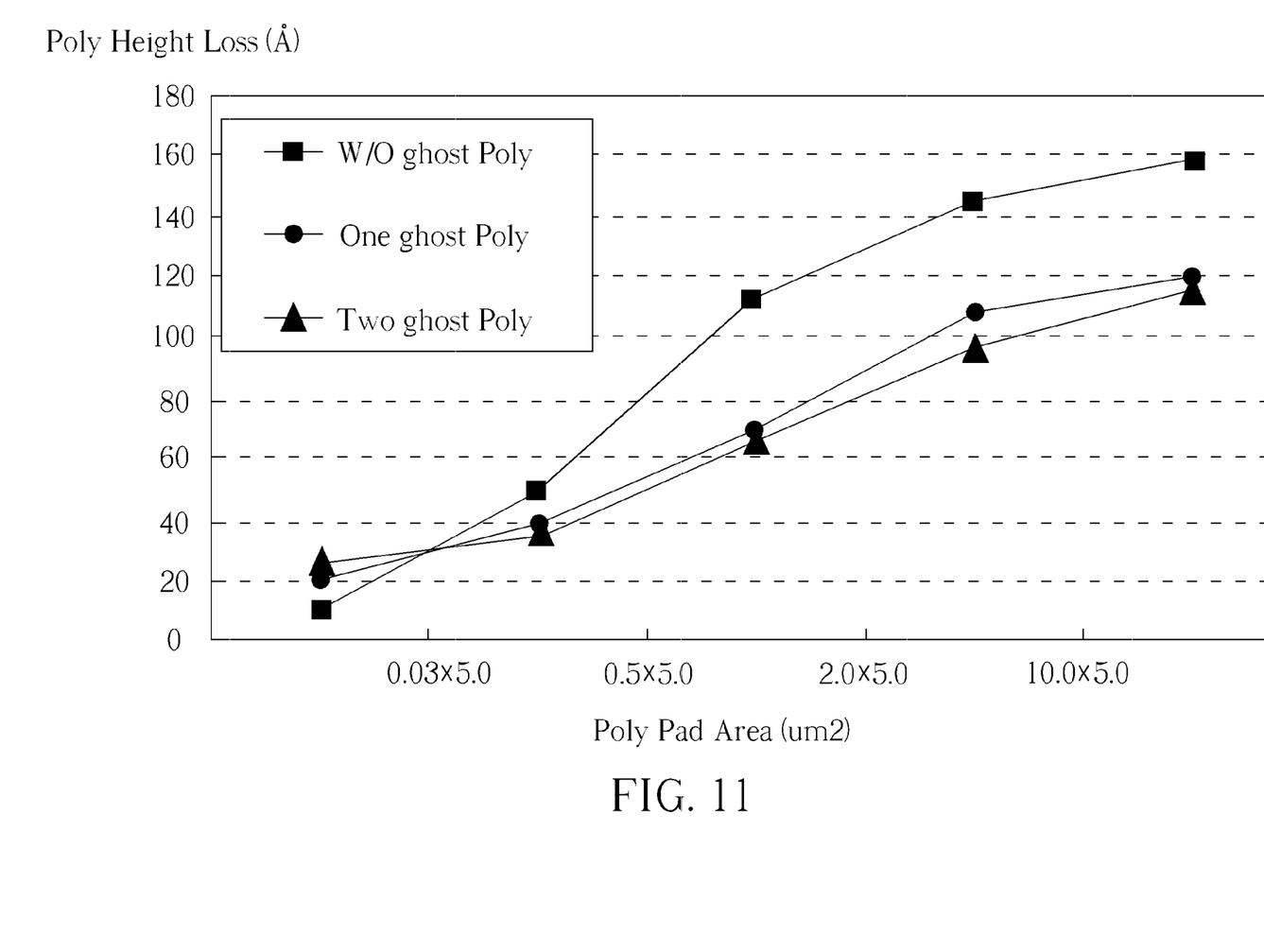
FIG. 11 is a graph showing the height loss comparison of the dummy gate with or without the auxiliary dummy structures

Please refer to FIG. 11, which is a graph showing the height loss comparison of the dummy gate 210 with or without the auxiliary dummy structures. According to FIG. 11, it is found that the auxiliary dummy structure 212 transfers the consumption from the edges of the dummy gate to the edges of the auxiliary dummy structures. Consequently, consumption to the polysilicon layer and the height loss are both mitigated. Furthermore, it is observed when the line width S of the dummy gate 210 is larger than 2 μm, the height loss problem can be efficiently mitigated by the auxiliary dummy structures 212.

Please refer to FIG. 8 and FIG. 9. After the two CMP processes, the dummy gate 210 of the semiconductor device 230 is removed to form a gate trench (not shown). Additionally, the auxiliary dummy structures 212 can be removed simultaneously with removing the dummy gate 210. And thus dummy trenches (not shown) are formed on the substrate 200. Subsequently, a work function metal layer 252 and a filling metal layer 254 are sequentially formed in the gate trench and the dummy trench and followed by performing another CMP process for removing unnecessary metal layers. Consequently, a metal gate 250 and an auxiliary dummy structure 214 are respectively formed in the gate trench and the dummy trench as shown in FIG. 8. Additionally, an etch stop layer (not shown) can be formed between the work function metal layer 252 and high-k gate dielectric layer 204, and a top barrier layer (not shown) can be formed between the work function metal layer 252 and the filling metal layer 254 if required. The etch stop layer can include tantalum nitride (TaN) and the top barrier layer can include TiN, but both not limited to this. According to the preferred embodiment, the work function metal layer 252 can include suitable materials providing an appropriate work function for the p-type semiconductor device or n-type semiconductor device. Therefore, the work function metal layer 252 has a work function, and the work function can be between 4.8 eV and 5.2 eV, or alternatively between 3.9 eV and 4.3 eV. The filling metal layer 254 includes materials with low resistance and superior gap-filling characteristic, such as aluminum (Al), titanium aluminide (TiAl) or titanium aluminum oxide (TiAlO), but not limited to this.

It is noteworthy that when the preferred embodiment is integrated with the high-k last process, the gate dielectric layer 204 can include the conventional SiO layer and serve as the interfacial layer after forming the gate trench. Subsequently, a high-k gate dielectric layer (not shown), a bottom barrier layer (not shown), an etch stop layer (not shown), a work function metal layer 252, a top barrier layer (not shown), and a filling metal layer 254 are sequentially formed on the interfacial layer 204 in the gate trench 250 and on the substrate 200 and the metal gate 250 is obtained. More important, the metal gate 250 always includes a second height $H_2$ no matter the preferred embodiment is integrated with the high-k first or high-k last process. Since the first height $H_1$ (depicted by the dashed line for comparing as shown in FIG. 8) does not suffer any loss in the CMP process, a depth of the gate trench is the same with the first height $H_1$, and the second height $H_2$ of the metal gate 250 that is formed in the gate trench inherently is equal to the first height $H_1$ of the dummy gate 210. In addition, the ILD layer 244 and the CESL 242 can be selectively removed and sequentially reformed on the substrate 200 for improving performance of the semiconductor device 230 in the preferred embodiment.

Please refer to FIG. 8 again. According to the manufacturing method provided by the first preferred embodiment, a semiconductor device 230 having metal gate 250 is obtained. Furthermore, each semiconductor device 230 includes a pair of auxiliary dummy structures 214 positioned respectively at the two sides of the metal gate 250 on the substrate 200. Furthermore, the auxiliary dummy structures 214 are electrically isolated from the metal gate 250.

It is noteworthy that though the conductive material also fills up the dummy trench as well the gate trench when forming the work function metal layer 252 and the filling metal layer 254 and thus the auxiliary dummy structures 214 are formed as shown in FIG. 8, the auxiliary dummy structures 214 are still electrically isolated from other elements. It is because the auxiliary dummy structures 214 are formed on the STIs 202 and surrounded by the dielectric structure 240. Accordingly, the metal materials remained in the auxiliary dummy structures 214 renders no influence or impact to the electrical performance of the semiconductor device 230.

Figure 10:
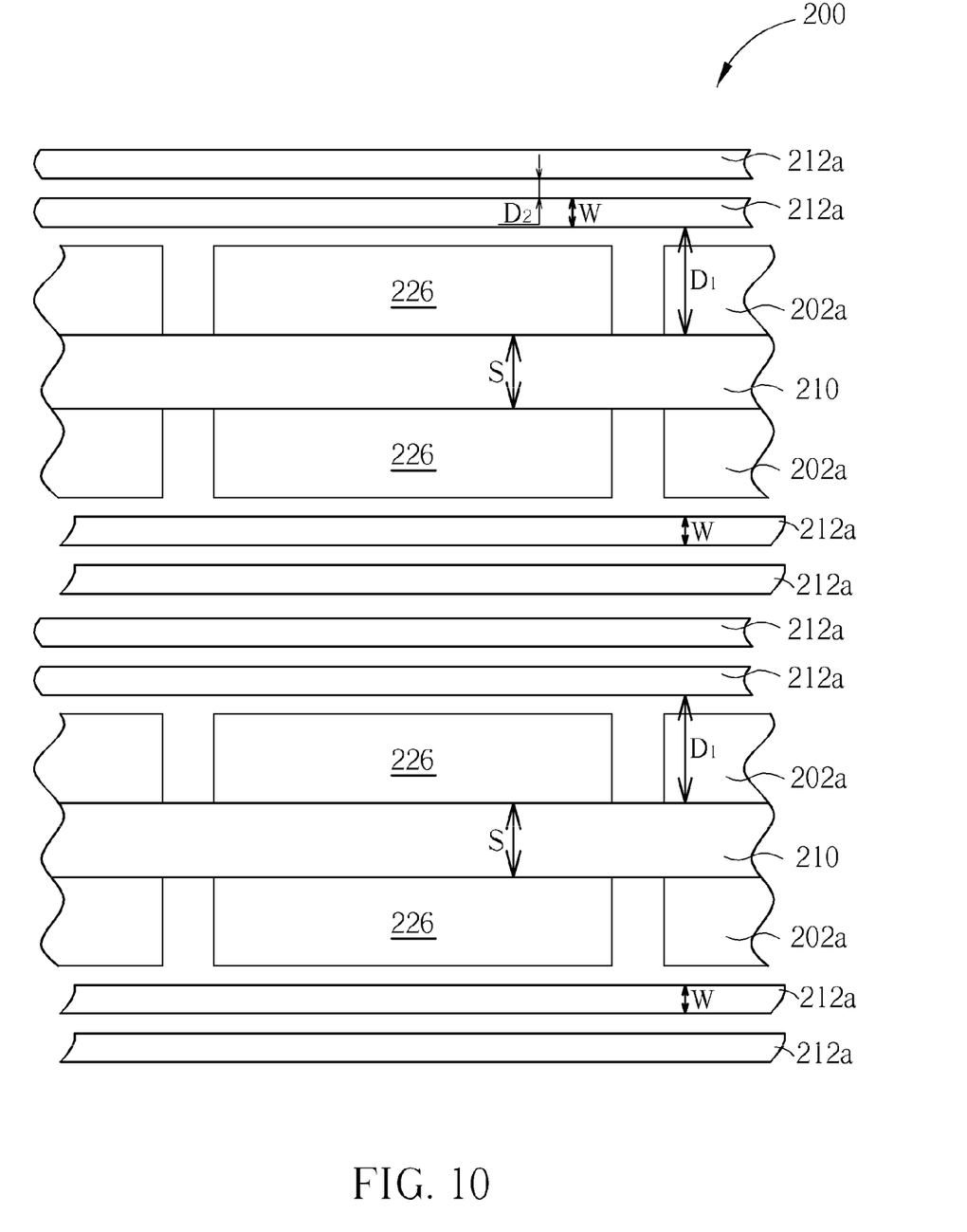
FIG. 10 is a top view illustrating a manufacturing method for a semiconductor device having metal gate provided by a second preferred embodiment of the present invention.

Please refer to FIG. 10, which is a top view illustrating a manufacturing method for a semiconductor device having metal gate provided by a second preferred embodiment of the present invention. It should be noted that the steps of the second materials are the same with those of the first preferred embodiment; therefore those steps are omitted for simplicity. Furthermore, elements the same in both first and second embodiments are designated by the same numerals. More important, for clarifying and emphasizing the spatial relationship between the auxiliary dummy structures 212 and the dummy gate 210, the LDDs 220, the first spacer 222, the second spacer 224, and the silicides 228 are omitted from FIG. 10. However those skilled in the art would easily realize that those elements should not be ignored.

Please refer to FIG. 10, what difference between the first preferred embodiment and the second preferred embodiment is: The second preferred embodiment provides auxiliary dummy structures 212a, and each auxiliary dummy structure 212a comprises a multiple bar-like structure. The auxiliary dummy structure 212a includes a width W that is the same with the auxiliary dummy structure 212 described in the first preferred embodiment, and the width W is between about 0.03 μm and about 0.1 μm. The dummy gate 210 and the auxiliary dummy structure 212a proximal to the dummy gate 210 include a first spacing width $D_1$ defined therebetween. The first spacing width $D_1$ is between about 0.1 μm and about 0.18 μm. As mentioned above, the preferred embodiment always forms the auxiliary dummy structures 212a when the line width S of the dummy gate 210 is larger than 1 μm. More important, the multiple bar-like structure 212a includes a second spacing width $D_2$ defined therebetween and the second spacing width $D_2$ is between about 0.12 μm and about 0.23 μm. As mentioned above, since the steps for forming the auxiliary dummy structures 212a are all the same with those described in the first preferred embodiment, a second spacer (not shown) is respectively formed on sidewalls of the auxiliary dummy structures 212a simultaneously with forming the first spacer 222 of the semiconductor device 230.

According to the auxiliary dummy structures 212a that includes multiple bar-like structure, the buffer function rendered by the auxiliary dummy structures 212a is improved and thus the first height $H_1$ of the dummy gate is more impervious to the CMP consumption. Furthermore, since the auxiliary dummy structures 212a include the multiple bar-like structure, the adjacent dummy gates 210 can share one set of the auxiliary dummy structures 212a. However, it is not limited to form the multiple bar-like auxiliary dummy structures 212a respectively at two sides of the adjacent dummy gates 210 as shown in FIG. 10.

According to the manufacturing method for a metal gate provided by the present invention, a pair of auxiliary dummy structures is formed respectively at the two sides of the dummy gate simultaneously with forming the dummy gate. Because of the auxiliary dummy structures, the consumption to edges of the dummy gate, particularly at where the dummy gate adjoining the dielectric structure, is transferred to the edges of the auxiliary dummy structures, particularly at where the auxiliary dummy structure adjoining the dielectric structure. In other words, the auxiliary dummy structure serves a sufficient buffer structure and thus CMP consumption is transferred to the auxiliary dummy structure. Consequently, no consumption is occurred to the polysilicon layer, and thus no height deviation is resulted between the center of the dummy gate and the edges of the dummy gate. In other words, no height loss is resulted in the dummy gate after the dummy gate is exposed. More important, the metal gate subsequently formed obtains a height equal to the original height of the dummy gate. In other words, the metal gate is ensured to have a height the same with original height of dummy gate without any loss. Accordingly, the present invention provides a semiconductor device having metal gate and a manufacturing method thereof ensures the electrical performance and reliability of the metal gate.

Moreover, because the auxiliary dummy structure is integrated in the fabrication of the semiconductor device, the manufacturing method of the present invention is provided without increasing any process cost. Additionally, it is found that height loss is more serious when the density of the dummy gate is increased, therefore the manufacturing method of the present invention is preferably provided to solve the height loss issue when the density of the dummy gate is larger than 65%. Briefly speaking, the manufacturing method provided by the present invention is more preferably used to form the semiconductor device having high device density.

Those skilled in the art will readily observe that numerous modifications and alterations of the device and method may be made while retaining the teachings of the invention.

What is claimed is:

1. A semiconductor device having a metal gate comprising:
   a substrate having a plurality of shallow trench isolations (STIs) formed therein;
   at least a the metal gate positioned on the substrate; and
   at least a pair of auxiliary dummy structures respectively positioned at two sides of the metal gate, the pair of auxiliary dummy structures being entirely positioned on the STIs.

2. The semiconductor device having the metal gate according to claim 1, wherein the pair of auxiliary dummy structures are electrically isolated from the metal gate.

3. The semiconductor device having the metal gate according to claim 1, wherein the pair of auxiliary dummy structures and the metal gate comprises a first spacing width defined therebetween, and the first spacing width is between 0.1 µm and 0.18 µm.

4. The semiconductor device having the metal gate according to claim 1, wherein the pair of auxiliary dummy structures comprises a width, and the width is between 0.03 µm and 0.1 µm.

5. The semiconductor device having the metal gate according to claim 1, wherein the metal gate comprises a line width, and the line width is larger than 1 µm.

6. The semiconductor device having the metal gate according to claim 1, wherein the pair of auxiliary dummy structures comprises a multiple bar-like structure.

7. The semiconductor device having the metal gate according to claim 6, wherein the multiple bar-like structure comprises a second spacing width defined therebetween, and the second spacing width is between 0.12 µm and 0.23 µm.

8. The semiconductor device having the metal gate according to claim 1, further comprising:
   lightly-doped drains positioned in the substrate respectively at two sides of the metal gate;
   a first spacer positioned on sidewalls of the metal gate; and
   a source/drain positioned in the substrate respectively at two sides of the metal gate.

9. The semiconductor device having the metal gate according to claim 1, wherein the pair of auxiliary dummy structures further comprises a second spacer formed on sidewalls of the pair of auxiliary dummy structures.

* * * * *